(12) United States Patent
Lee

(10) Patent No.: US 8,692,581 B2
(45) Date of Patent: Apr. 8, 2014

(54) CONSTANT SWITCHING CURRENT FLIP-FLOP

(75) Inventor: Minjae Lee, Mountain View, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 210 days.

(21) Appl. No.: 13/170,402

(22) Filed: Jun. 28, 2011

(65) Prior Publication Data

US 2013/0002325 A1    Jan. 3, 2013

(51) Int. Cl.
*H03F 3/45* (2006.01)
*H03K 3/356* (2006.01)

(52) U.S. Cl.
USPC ............... 327/57; 327/55; 327/208; 327/211; 327/218

(58) Field of Classification Search
USPC .................. 327/51, 52, 54–57, 202, 203, 208, 327/210–212, 214, 215, 217, 218
See application file for complete search history.

(56) References Cited

U.S. PATENT DOCUMENTS

| | | | | |
|---|---|---|---|---|
| 6,107,853 A * | 8/2000 | Nikolic et al. | | 327/217 |
| 6,232,810 B1 * | 5/2001 | Oklobdzija et al. | | 327/217 |
| 6,633,188 B1 * | 10/2003 | Jia et al. | | 327/217 |
| 6,717,448 B2 * | 4/2004 | Heo et al. | | 327/202 |
| 6,756,823 B1 * | 6/2004 | Chen et al. | | 327/52 |
| 7,057,421 B2 * | 6/2006 | Shi et al. | | 327/55 |
| 7,362,153 B2 * | 4/2008 | Sumesaglam | | 327/202 |
| 7,764,102 B2 * | 7/2010 | Pacha et al. | | 327/208 |
| 2004/0008068 A1 * | 1/2004 | Kim | | 327/218 |

OTHER PUBLICATIONS

Minjae Lee et al., "A 9 b, 1.25 ps Resolution Coarse—Fine Time-to-Digital Converter in 90 nm CMOS that Amplifies a Time Residue", IEEE Journal of Solid-State Circuits, vol. 43, Issue: 4, (Apr. 2008), pp. 769-777.

K. Tiri et al., "A dynamic and differential CMOS logic with signal independent power consumption to withstand differential power analysis on smart cards", Proceedings of the 28th European Solid-State Circuits Conference, (2002), pp. 403-406.

B. Nikolic et al., "Improved sense-amplifier-based flip-flop: design and measurements", IEEE Journal of Solid-State Circuits, vol. 35, Issue: 6, (Jun. 2000), pp. 876-884.

* cited by examiner

*Primary Examiner* — Patrick O'Neill

(57) ABSTRACT

A constant switching current flip-flop includes a latch circuit that provides latch outputs of the flip-flop, whereby the latch outputs are reset to zero at the beginning of each clock cycle to eliminate pattern dependent switching currents. The latch circuit is reset responsive to control signals provided without significant delay.

19 Claims, 4 Drawing Sheets

CONSTANT SWITCHING CURRENT FLIP-FLOP

BACKGROUND

Flip-flops are common building blocks in synchronous systems, and are typically implemented using conventional static complementary metal oxide semiconductor (CMOS) logic, which generates pattern dependent switching current. When used in analog circuits, such as analog to digital converters (ADCs), or in time domain signal processing, the pattern dependent switching current may contaminate analog signals through either the supply network or by substrate coupling, and may also contribute to heating device circuitry. Moreover, pattern dependent switching current may render secure devices, such as smart cards and cryptographic processors, vulnerable because the secret keys of the secure devices may be revealed by correlation to device power consumption through differential power analysis (DPA). There is thus a need to provide flip-flops that do not produce pattern dependent switching currents.

SUMMARY

In a representative embodiment, a flip-flop includes an amplifier configured to provide an amplified output responsive to received input data and a clock; a latch configured to provide a latch output that is reset to zero during a reset period at the beginning of each clock cycle, and to provide a latch output responsive to the amplified output after the reset period of each clock cycle; and a generator configured to generate the control signals for each clock cycle responsive to the amplified output provided each clock cycle.

In another representative embodiment, a flip-flop includes an amplifier configured to provide an amplified output responsive to received input data and a clock; a latch including first and second transistors connected in series between an output node of the latch and ground, and configured to reset the output node to ground during a reset period at the beginning of each clock cycle of the clock responsive to respective first and second control signals; and a generator configured to generate the first and second control signals for each clock cycle responsive to the amplified output.

In another representative embodiment, a flip-flop includes a latch and a control signal generator. The latch is configured to receive an amplified output from an amplifier, responsive to input data and a clock, and to provide a latch output that is reset to zero during a reset period at the beginning of each clock cycle of the clock responsive to at least one control signal, and to provide a latch output responsive to the amplified output after the reset period of each clock cycle. The control signal generator is configured to generate the at least one control signal, the control signal generator including a first inverter configured to invert the amplified output, a buffer configured to delay an output of the first inverter, and a second inverter configured to invert an output of the buffer, where the output of the first inverter is provided as the at least one control signal.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
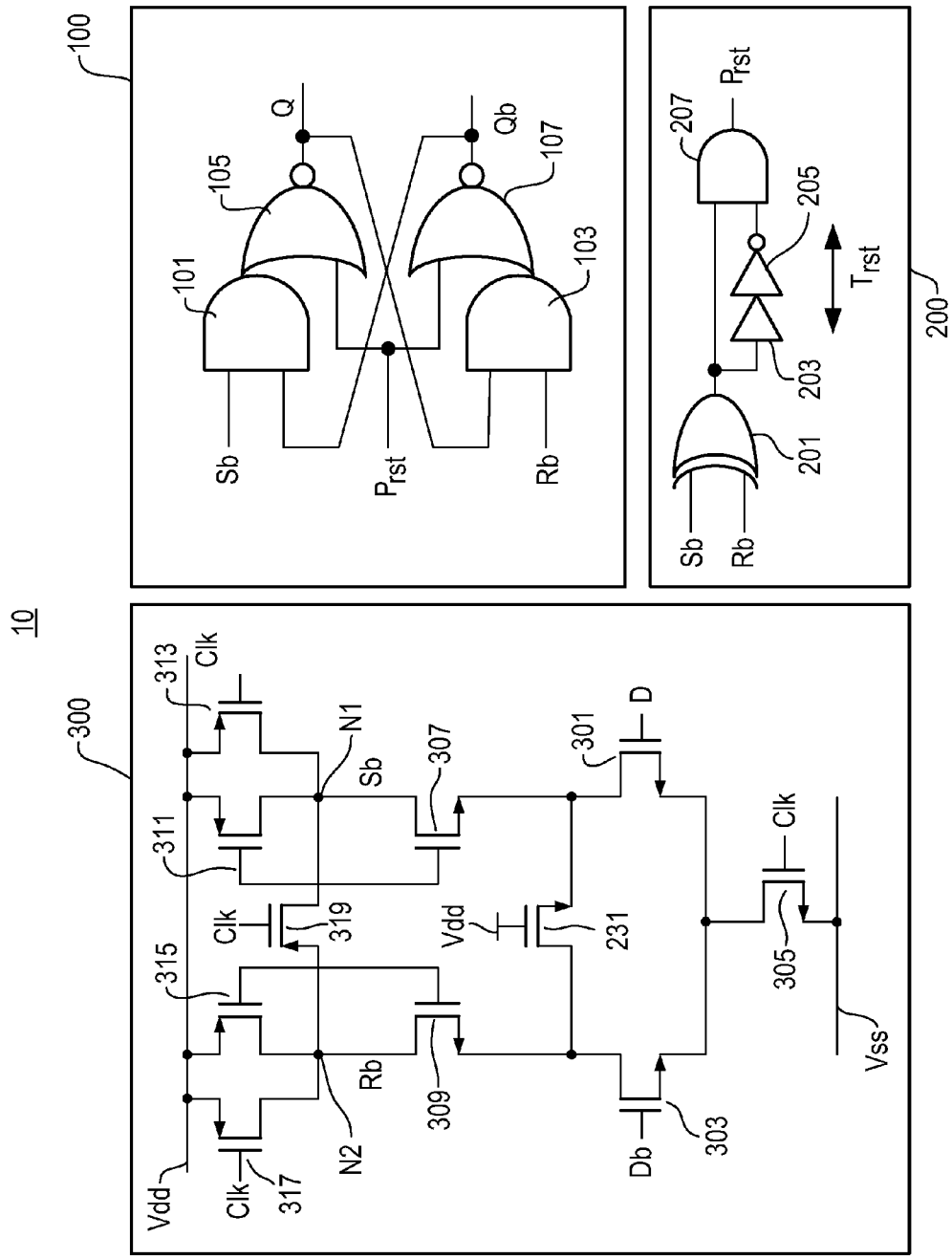
FIG. 1 is a block diagram illustrating a flip-flop according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

FIG. 1 is a block diagram illustrating a flip-flop according to a representative embodiment.

Referring to FIG. 1, flip-flop 10 is a constant switching current flip-flop (CSCFF). The flip-flop 10 as shown includes a resettable amplifier 300, a reset pulse generator 200 and an SR latch 100, which may be implemented using CMOS logic.

As shown in FIG. 1, resettable amplifier 300 has data inputs D and Db respectively connected to the gates of NMOS transistors 301 and 303. The sources of NMOS transistors 301 and 303 are connected to the drain of NMOS transistor 305. NMOS transistor 305 has a gate connected to clock CLK and a source connected to ground (Vss). The drain of NMOS transistor 301 is connected to the sources of NMOS transistors 307 and 321. The drain of NMOS transistor 307 is connected to node N1 which provides amplified output Sb from amplifier 300. The drain of NMOS transistor 303 is connected to the drain of NMOS transistor 321 and the source of NMOS transistor 309. The drain of NMOS transistor 309 is connected to node N2, which provides amplified output Rb from amplifier 300. The gate of NMOS transistor 321 is connected to the power supply Vdd.

As still further shown in FIG. 1, PMOS transistor 311 of amplifier 300 includes a drain connected to node N1, a source connected to power supply Vdd, and a gate connected to the gate of NMOS transistor 307 and node N1. PMOS transistor 313 includes a drain connected to node N1, a source connected to power supply Vdd, and a gate connected to clock CLK. PMOS transistor 315 includes a drain connected to node N2, a source connected to power supply Vdd, and a gate connected to the gate of NMOS transistor 309 and node N2. PMOS transistor 317 includes a drain connected to node N2, a source connected to power supply Vdd, and a gate connected to clock CLK. Also, PMOS transistor 319 includes a source connected to node N1, a drain connected to node N2 and a gate connected to clock CLK. Input data D and Db to the amplifier 300 may be digital and/or analog, and amplified outputs Rb and Sb are responsive to the input data D and Db.

As further shown in FIG. 1, reset pulse generator 200 is configured to receive the amplified outputs Sb and Rb from amplifier 300. Reset pulse generator 200 includes EX-OR gate 201, which performs a logical EXCLUSIVE-OR operation on the amplified outputs Sb and Rb, and provides a corresponding output responsive to the logical EXCLUSIVE-OR operation. The output of EX-OR gate 201 is connected to delay buffer 203 and AND gate 207. Delay buffer 203 delays the output of EX-OR gate 210 and provides an output to inverter 205. An output of inverter 205 is provided as another input to AND gate 207. AND gate 207 performs a logical AND operation on the output of EX-OR gate 201 and the output of inverter 205. An output of AND gate 207 is provided as pulse reset signal Prst from reset pulse generator 200. Accordingly, pulse reset signal Prst is driven high for a short time duration Trst upon occurrence of either of two conditions: (1) when the amplified outputs Sb and Rb are both high and either of the amplified outputs Sb and Rb then transitions to zero, or (2) when the amplified outputs Sb and Rb are both zero and either of the amplified outputs Sb and Rb transitions to high. With respect to the representative configuration of amplifier 300 as shown in FIG. 1, the first condition for driving the pulse reset signal Prst high is applied. Complementary implementation of the amplifier 300 would utilize the second condition. As shown in FIG. 1, the duration Trst of the reset period or window may be set by the delay applied to the output of EX-OR gate 210 by delay buffer 203 and inverter 205. As an example, the duration Trst of the reset period may be set to one tenth of clock cycle.

As also shown in FIG. 1, SR latch 100 is connected to receive amplified outputs Sb and Rb from amplifier 300, and pulse reset signal Prst from reset pulse generator 200. AND gate 101 has an input connected to amplified output Sb. AND gate 103 has an input connected to amplified output Rb. NOR gate 105 performs a logical NOR operation on the output of AND gate 101 and pulse reset signal Prst, and provides a corresponding latch output Q from SR latch 100 responsive to the logical NOR operation. NOR gate 107 performs a logical NOR operation on the output of AND gate 103 and pulse reset signal Prst, and provides a corresponding latch output Qb from SR latch 100 responsive to the logical NOR operation. Latch output Q is also connected to an input of AND gate 103, which performs a logical AND operation on latch output Q and amplified output Rb to provide the corresponding output that is connected to NOR gate 107. Latch output Qb is also connected to an input of AND gate 101, which performs a logical AND operation on latch output Qb and amplified output Sb to provide the corresponding output that is connected to NOR gate 105.

In the representative embodiment of FIG. 1, reset pulse generator 200 as idealized would eliminate the pattern dependent switching current generated by SR latch 100 of flip-flop 10 by providing the pulse reset signal Prst to reset latch outputs Q and Qb to zero (ground) at the beginning of every clock cycle of clock CLK. That is, SR latch 100 ideally would be reset during a reset period at the beginning of each clock cycle of clock CLK so that latch outputs Q and Qb are set to zero, and so that latch outputs Q and Qb are subsequently driven after the reset period of each clock cycle to values responsive to transitions in amplified outputs Sb and Rb. However, the inherent delay through reset pulse generator 200 shown in FIG. 1 may be significant, such that the transitions in amplified outputs Sb and Rb during a given clock cycle may propagate through SR latch 100 to latch outputs Q and Qb before pulse reset signal Prst is provided from reset pulse generator 200 during the given clock cycle. As a result, latch outputs Q and Qb of SR latch 100 may not be reset to zero, and undesirable pattern dependent switching current may consequently be generated.

Figure 2:
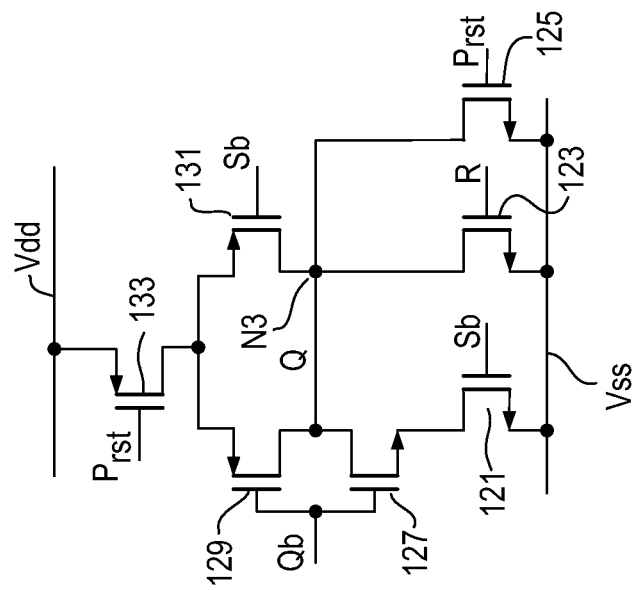
FIG. 2 illustrates a simplified transistor configuration of an SR latch according to the representative embodiment.

FIG. 2 illustrates a simplified transistor configuration of SR latch 100 useful to describe modifications that enable latch outputs Q and Qb to be set to zero during a reset period at the beginning of each clock cycle substantially immediately after the occurrence of transitions in amplified outputs Sb and Rb. In particular, FIG. 2 illustrates a simplified transistor configuration of the half of SR latch 100 that provides latch output Q, for use along with reset pulse generator 200 shown in FIG. 1.

As shown in FIG. 2, NMOS transistor 121 of the simplified transistor configuration of SR latch 100 includes a source connected to ground, a drain connected to NMOS transistor 127, and a gate connected to amplified output Sb provided from amplifier 300. NMOS transistor 123 includes a source connected to ground, a drain connected to node N3, and a gate connected to R (which corresponds to the inversion of amplified output Rb provided from amplifier 300). Amplified output Rb may be inverted by an inverter (not shown) disposed as either part of amplifier 300, part of SR latch 100, or generally as part of flip-flop 10. NMOS transistor 125 includes a source connected to ground, a gate connected to pulse reset signal Prst provided from reset pulse generator 200, and a drain connected to node N3. NMOS transistor 127 includes a source connected to the drain of NMOS transistor 121, a gate connected to latch output Qb of SR latch 100, and a drain connected to node N3. PMOS transistor 129 includes a drain connected to node N3, and a gate connected to latch output Qb. PMOS transistor 131 includes a drain connected to node N3, and a gate connected to amplified output Sb. PMOS transistor 133 includes a drain connected to the sources of PMOS transistors 129 and 131, a gate connected to pulse reset signal Prst, and a source connected to power supply Vdd. As shown, latch output Q is provided as an output of SR latch 100 via node N3.

During operation of SR latch 100 shown in FIG. 2, NMOS transistor 125 is turned on when pulse reset signal Prst is driven high during the reset period to pull down node N3 to ground, thus resetting latch output Q to zero. At the same time, PMOS transistor 133 is held in an OFF state by the pulse reset signal Prst, to ensure that power supply Vdd is disconnected from node N3 and thus does not pull latch output Q high during the reset period.

As mentioned above, for the sake of simplifying the drawings and explanation, FIG. 2 does not illustrate a simplified transistor configuration of the other half of SR latch 100 that provides latch output Qb. However, as would be apparent to one of ordinary skill in the art, the other half of SR latch 100 includes a set of MOS transistors configured and interconnected in a manner similar to the MOS transistors shown in FIG. 2, whereby amplified output Rb (as opposed to amplified output Sb) is connected to the transistors of the other half that correspond to NMOS transistor 121 and PMOS transistor 131, S (which corresponds to the inversion of amplified output Sb provided from amplifier 300) (as opposed to R) is connected to the transistor of the other half that corresponds to NMOS transistor 123, and latch output Q (as opposed to latch output Qb) is connected to the gates of the transistors of the other half that correspond to NMOS transistor 127 and PMOS transistor 129.

As described previously, because of the delay through reset pulse generator 200 shown in FIG. 1, the pulse reset signal Prst may be provided to SR latch 100 during a given clock cycle after the transitions in amplified outputs Sb and Rb have propagated through SR latch 100 during the given clock cycle. This delay primarily results from operation of EX-OR gate 201 and AND gate 207.

Figure 3:
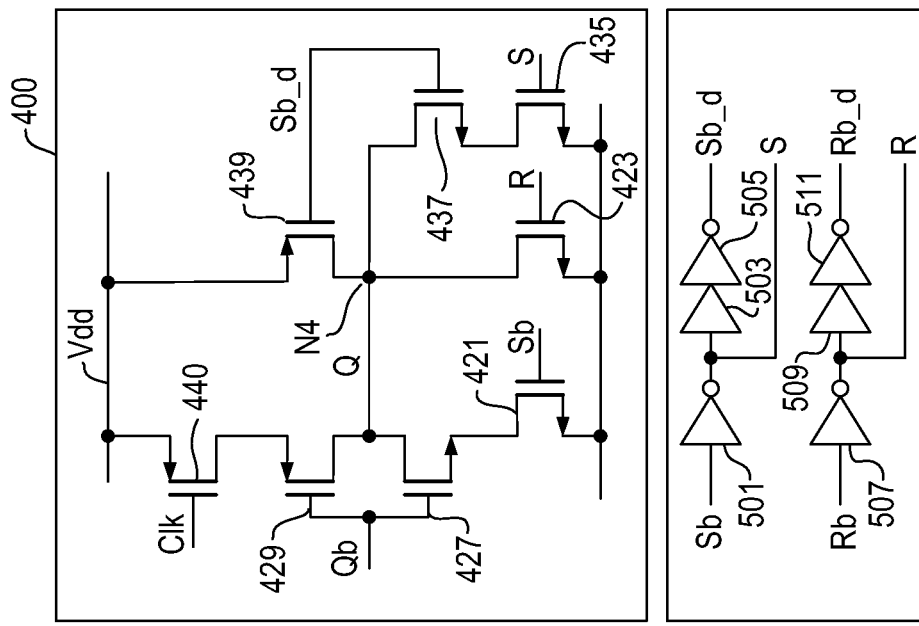
FIG. 3 illustrates an SR latch and a control signal generator according to a representative embodiment.

FIG. 3 illustrates SR latch 400 and control signal generator 500 according to a representative embodiment. Control signal generator 500 generates control signals that control SR latch 400 to reset the latch outputs Q and Qb to zero during a reset period at the beginning of each clock cycle. The control signal generator 500 and the SR latch 400 may be implemented using CMOS logic, for example. Control signal generator 500 is configured by inverters and delay buffers, without any logic gates, such as EX-OR gate 201 and AND gate 207, included in reset pulse generator 200 shown in FIG. 1. The control signals can thus be provided by control signal generator 500 almost immediately after transitions in amplified outputs Sb and Rb, i.e., without the delay introduced by the logic gates, particularly the EX-OR gate 201 and AND gate 207. SR latch 400 is configured in depicted representative embodiment to be responsive to the control signals (e.g., control signals Sb_d and Rb_d) generated by control signal generator 500 instead of a pulse reset signal (e.g., pulse reset signal Prst shown in FIG. 2). Because the control signals are securely provided from control signal generator 500 to SR latch 400 at the beginning of each clock cycle without significant delay, latch outputs Q and Qb are reset to zero before transitions in amplified outputs Sb and Rb propagate through to latch outputs Q and Qb, thus avoiding generation of pattern dependent switching current.

SR latch 400 and control signal generator 500 will be described in detail as follows with reference to FIG. 3.

In the depicted embodiment, control signal generator 500 is connected to receive amplified outputs Sb and Rb from amplifier 300 shown in FIG. 1. Inverter 501 (first inverter) is connected to receive and invert amplified output Sb to provide a first control signal S as output from control signal generator 500. Delay buffer 503 is connected to receive and delay the output of inverter 501. Inverter 505 (second inverter) is connected to receive and invert the output of delay buffer 503, to provide a second (delayed) control signal Sb_d as output from control signal generator 500. Similarly, inverter 507 (third inverter) is connected to receive and invert amplified output Rb to provide a third control signal R as output from control signal generator 500. Delay buffer 509 is connected to receive and delay the output of inverter 507. Inverter 511 (fourth inverter) is connected to receive and invert the output of delay buffer 509, to provide a fourth (delayed) control signal Rb_d as output from control signal generator 500. The duration Trst of the reset period or window may be set by the delay applied to the output of inverter 501 by delay buffer 503 and inverter 505, and/or the delay applied to the output of inverter 507 by delay buffer 509 and inverter 511. As noted above, for a clock cycle of 2.5 ns, the duration Trst of the reset period may be set to 200 ps in a CMOS 65 nm process, for example.

Similar to the transistor configuration of SR latch 100 shown in FIG. 2, for the sake of simplifying the drawings and explanation, SR latch 400 shown in FIG. 3 is a transistor configuration of a half of the SR latch that provides latch output Q. The other half of SR latch 400 that provides latch output Qb includes a set of MOS transistors configured and interconnected in a manner similar to the MOS transistors shown in FIG. 3, which would be apparent to one of ordinary skill in the art in view of the description of FIG. 4, below.

SR latch 400 as shown in FIG. 3 is connected to receive amplified outputs Sb and Rb provided from amplifier 300 shown in FIG. 1, clock CLK, and the control signals provided from control signal generator 500. NMOS transistor 421 includes a source connected to ground, a gate connected to amplified output Sb, and a drain connected to NMOS transistor 427. NMOS transistor 423 includes a source connected to ground, a gate connected to third control signal R, and a drain connected to node N4. NMOS transistor 427 includes a source connected to the drain of NMOS transistor 421, a gate connected to latch output Qb, and a drain connected to node N4. PMOS transistor 429 includes a drain connected to node N4, and a gate connected to latch output Qb. NMOS transistors 421, 423, and 427, and PMOS transistor 429 in SR latch 400 are configured and interconnected in a similar manner as respective NMOS transistors 121, 123, and 127, and PMOS transistor 129 in SR latch 100, discussed above.

SR latch 400 as shown in FIG. 3 further includes NMOS transistor 435 which includes a source connected to ground, and a gate connected to first control signal S. NMOS transistor 437 includes a source connected to the drain of NMOS transistor 435, a gate connected to second control signal Sb_d, and a drain connected to node N4. PMOS transistor 439 includes a drain connected to node N4, a gate connected to second control signal Sb_d, and a source connected to power supply Vdd. PMOS transistor 440 includes a drain connected to the source of PMOS transistor 429, a gate connected to clock CLK, and a source connected to power supply Vdd.

The manner in which SR latch 400 shown in FIG. 3 is different than SR latch 100 shown in FIG. 2 will now be described.

The latch output Q (node N3) is reset to zero in SR latch 100 shown in FIG. 2 by NMOS transistor 125, which pulls down node N3 to zero responsive to pulse reset signal Prst provided by reset pulse generator 200. That is, NMOS transistor 125 in SR latch 100 is turned on momentarily to reset node N3 to zero responsive to pulse reset signal Prst as a result of the occurrence of either of two events: 1) amplified output Sb transitioning to zero, or 2) amplified output Rb transitioning to zero.

In contrast, latch output Q (node N4) is reset to zero in SR latch 400 shown in FIG. 3 by stacked NMOS transistor 435 and NMOS transistor 437, which pull down node N4 to zero responsive to first control signal S and second control signal Sb_d, respectively, provided by control signal generator 500. On the other hand, latch output Q (node N4) is also reset to zero by NMOS transistor 423, which pulls down node N4 to zero responsive to third control signal R provided by control signal generator 500. As configured, a pulse reset signal Prst is not needed to pull down node N4 to zero in SR latch 400. Reset pulse generator 200 can thus be simplified to include only delay buffers and inverters, such as those used in reset pulse generator 500, which provide control signals without significant delay otherwise caused by EX-OR and AND logic gates, such as those used in reset pulse generator 200. Latch output Q of SR latch 400 is thus securely reset to zero at the beginning of each clock cycle of clock CLK without significant delay.

Additionally, SR latch 100 in FIG. 2 includes a first pull-up path to node N3 (latch output Q) including PMOS transistors 129 and 133, and a second pull-up path to node N3 including PMOS transistors 131 and 133. PMOS transistor 133 is turned off by pulse reset signal Prst provided by reset pulse generator 200, so that the first and second pull-up paths are disabled and no active pull-up paths are connected to node N3 during the reset period. The first pull-up path including PMOS transistors 129 and 133 is only turned on during a latching stage of each clock cycle, not during the reset period. Similarly, the second path including PMOS transistors 131 and 133 should be turned off during the reset period.

In contrast, SR latch 400 in FIG. 3 includes a first pull-up path to node N4 (latch output Q) including PMOS transistors 429 and 440, and a second pull-up path to node N4 including PMOS transistor 439. PMOS transistor 440 is turned off by clock CLK, so that the first pull-up path to node N4 including PMOS transistors 429 and 440 is disabled during the reset period. PMOS transistor 439 is turned off responsive to second control signal Sb_d, so that the second pull-up path to node N4 is disabled during the reset period. Since second control signal Sb_d is the delayed version of amplified output Sb, PMOS transistor 439 is guaranteed to be driven off during the reset period. Latch output Q of SR latch 400 is thus securely reset to zero during the reset period without being pulled-up by crow bar currents, for example.

Figure 4:
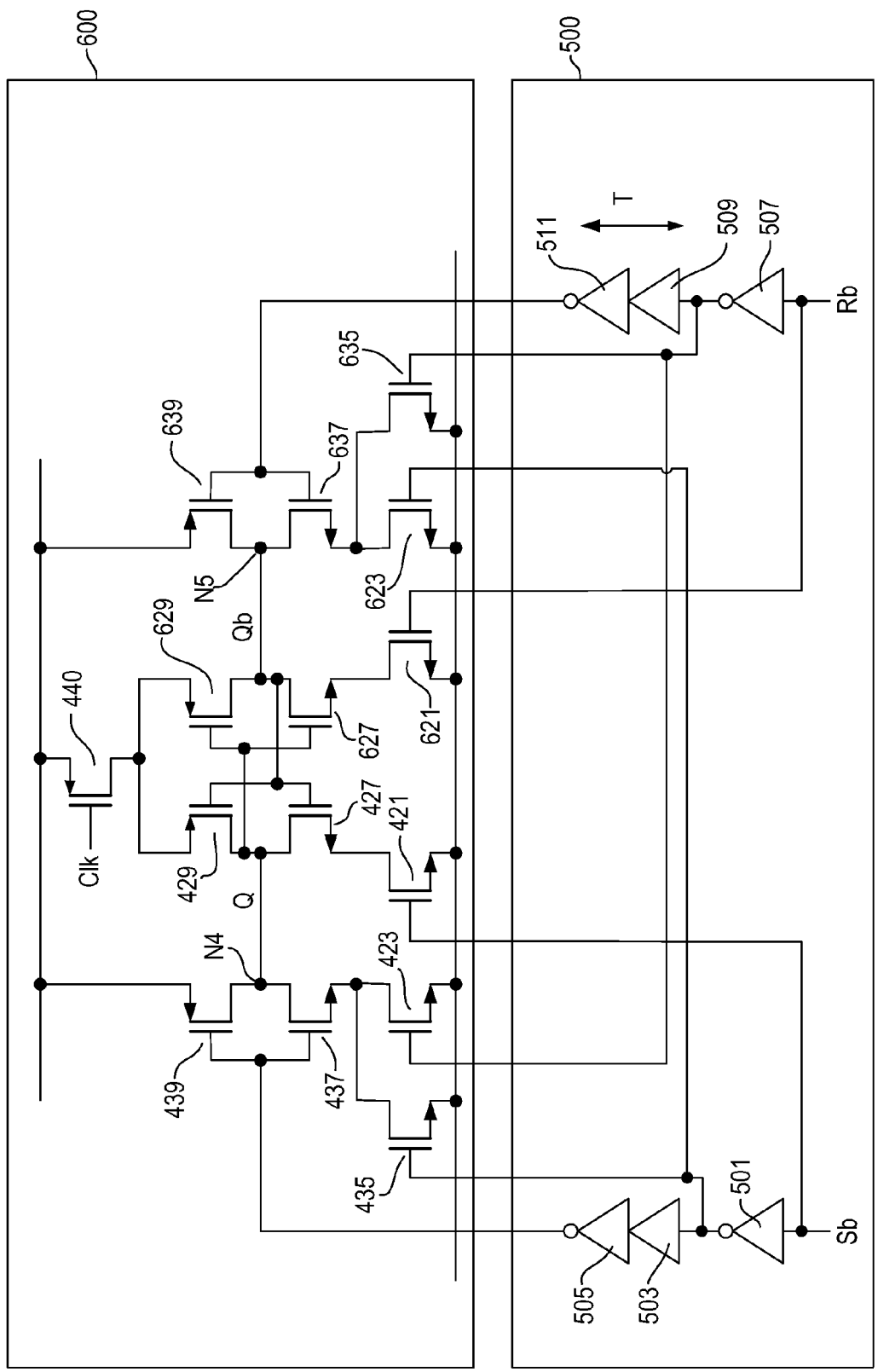
FIG. 4 illustrates a complete SR latch and a control signal generator according to a representative embodiment.

FIG. 4 illustrates a complete SR latch 600 and control signal generator 500 according to a representative embodiment. SR latch 600 shown in FIG. 4 is a transistor configuration of a complete SR latch that provides latch output Q and latch output Qb. Control signal generator 500 in FIG. 4 includes inverters 501, 505, 507, and 511, and delay buffers 503 and 509 that are the same as shown in FIG. 3. Description of these like circuit elements of control signal generator 500 in FIG. 4 is not repeated.

SR latch 600 in FIG. 4 includes NMOS transistors 421, 423, 427, 435, and 437, and PMOS transistors 429, 439 and 440 that are configured and function as described above with reference to FIG. 3, to provide latch output Q. NMOS transistor 421 includes a source connected to ground, a gate connected to amplified output Sb, and a drain connected to NMOS transistor 427. NMOS transistor 423 includes a source connected to ground, a gate connected to third control signal R, and a drain connected to the source of NMOS transistor 437. NMOS transistor 427 includes a source connected to the drain of NMOS transistor 421, a gate connected to latch output Qb, and a drain connected to node N4. PMOS transistor 429 includes a drain connected to node N4, a gate connected to latch output Qb, and a source connected to NMOS transistor 440. NMOS transistor 435 includes a source connected to ground, a gate connected to first control signal S, and a drain connected to NMOS transistor 437. NMOS transistor 437 includes a source connected to the drain of NMOS transistor 435 and the drain of NMOS transistor 423, a gate connected to second control signal Sb_d, and a drain connected to node N4. PMOS transistor 439 includes a drain connected to node N4, a gate connected to second control signal Sb_d, and a source connected to power supply Vdd. PMOS transistor 440 includes a drain connected to the source of PMOS transistor 429, a gate connected to clock CLK, and a source connected to power supply Vdd.

SR latch 600 in FIG. 4 further includes NMOS transistors 621, 623, 627, 635, and 637, and PMOS transistors 629 and 639 that provide latch output Qb. NMOS transistor 621 includes a source connected to ground, a gate connected to amplified output Rb, and a drain connected to NMOS transistor 627. NMOS transistor 623 includes a source connected to ground, a gate connected to first control signal S, and a drain connected to the source of NMOS transistor 637. NMOS transistor 627 includes a source connected to the drain of NMOS transistor 621, a gate connected to latch output Q, and a drain connected to node N5. PMOS transistor 629 includes a drain connected to node N5, a gate connected to latch output Q, and a source connected to the drain of PMOS transistor 440. NMOS transistor 635 includes a source connected to ground, a gate connected to third control signal R, and a drain connected to NMOS transistor 637. NMOS transistor 637 includes a source connected to the drain of NMOS transistor 635 and the drain of NMOS transistor 623, a gate connected to fourth control signal Rb_d, and a drain connected to node N5. PMOS transistor 639 includes a drain connected to node N5, a gate connected to fourth control signal Rb_d, and a source connected to power supply Vdd.

As previously described with reference to FIG. 3, stacked NMOS transistor 435 and NMOS transistor 437 pull down node N4 to zero respectively responsive to first control signal S and second control signal Sb_d. Additionally, PMOS transistor 440 is turned off by clock CLK so that a first pull-up path to node N4 (latch output Q) including PMOS transistors 429 and 440 is disabled during the reset period. PMOS transistor 439 is turned off responsive to second control signal Sb_d, to disable a second pull-up path to node N4 during the reset period. Likewise, stacked NMOS transistor 635 and NMOS transistor 637 pull down node N5 to zero respectively responsive to third control signal R and fourth control signal Rb_d provided by control signal generator 500. PMOS transistor 440 is turned off by clock CLK, so that a first pull-up path to node N5 (latch output Qb) including PMOS transistors 629 and 440 is disabled during the reset period. PMOS transistor 639 is also turned off responsive to fourth control signal Rb_d, so that a second pull-up path to node N5 is disabled during the reset period. Since fourth control signal Rb_d is the delayed version of amplified output Rb, PMOS transistor 639 is guaranteed to be driven off during the reset period. Latch output Qb of SR latch 600 can thus be securely reset to zero during the reset period without being pulled-up by crow bar currents, for example.

In contrast to SR latch 400 shown in FIG. 3, NMOS transistor 423 in SR latch 600 shown in FIG. 4 includes a drain connected to the source of NMOS transistor 437, instead of a drain connected to node N4. Somewhat similarly, the drain of NMOS transistor 623 is connected to the source of NMOS transistor 637. Because the drains of NMOS transistors 423 and 623 are respectively connected to NMOS transistors 437 and 637 as shown in FIG. 4, the same parasitic capacitance will be realized at amplified outputs Sb and Rb and in the pull-down paths of Q and Qb. As a result, mismatch and pattern dependent parasitic capacitive switching can be reduced. While either of control signal S and control signal R are switching immediately responsive to changes in amplified outputs Sb and Rb, NMOS transistors 427,437 and 635, or NMOS transistors 627, 637 and 435, will be on during the reset period Trst, to provide the output reset path.

FIGS. 5(a) and 5(b) illustrate simulation results of a constant switching current flip-flop of a representative embodiment. In FIG. 5(a), latch outputs Q and Qb of a flip-flop of a representative embodiment including amplifier 300, control signal generator 500 and SR latch 600 are plotted for one clock cycle, whereby the clock cycle is repeated and the corresponding plots of each clock cycle are overlapped on each other. Although any clock cycle may be used, the clock cycle in the depicted example is 400 MHz and the outputs are shown for a 2.5 nsec period.

In FIG. 5(a), a constant data pattern is applied to the flip-flop of the representative embodiment, so the latch outputs Q and Qb of SR latch 600 have opposite respective logical low and high values. Alternatively, a 0101 toggling data pattern may be applied to the flip-flop, which would yield substantially the same plots. Further, the respective values of the latch outputs Q and Qb may be reversed, which likewise would yield substantially the same plots (with opposite values). Once clock CLK toggles high, both latch outputs Q and Qb will be reset to the logical low (zero) value as shown at about 0.2 nsec, responsive to the control signals provided by control signal generator 500. Then after the reset period ends, both latch outputs Q and Qb will transition to respective valid logical low and high values. This is repeated for every clock cycle, whereby the latch outputs Q and Qb are securely reset to zero. For the different input data patterns, such as the constant pattern and the 0101 toggling data pattern, the outputs Q and Qb always reset to zero first and then trace back to where they should settle finally. Therefore each of the outputs Q and Qb draw the same switching current at the output.

Figure 5:
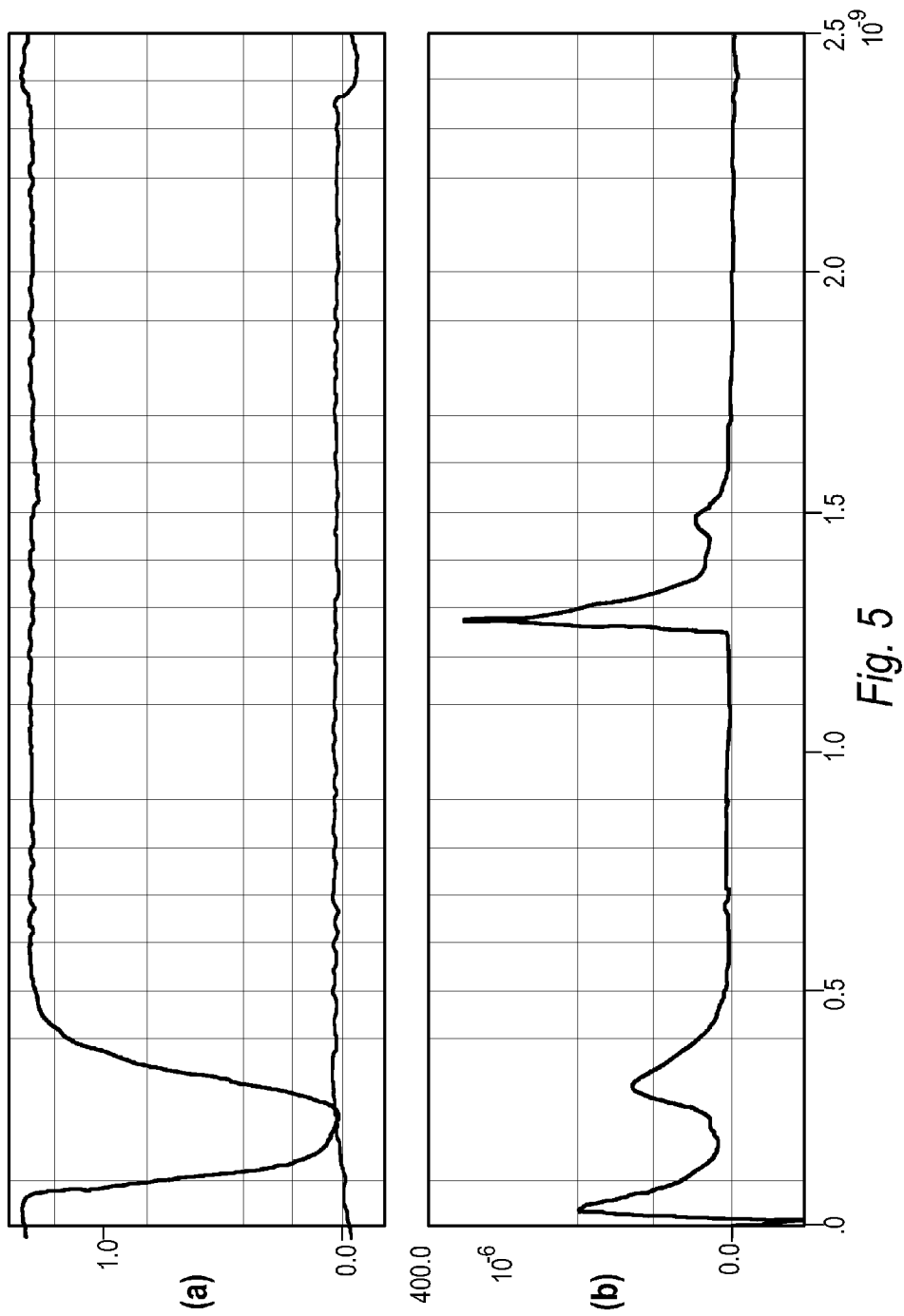
FIGS. 5(a) and 5(b) illustrates simulation results of a constant switching current flip-flop of a representative embodiment.

In FIG. 5(*b*), the switching current waveform of the flip-flop of the representative embodiment is shown for one clock cycle for a 2.5 nsec period with the constant pattern applied. Application of the 0101 toggling data pattern would yield substantially the same switching current waveform. In other words, the switching current waveform stays the same for any data pattern applied to the flip-flop of the representative embodiment. FIG. 5(*b*) demonstrates that the constant switching current flip-flop of the representative embodiment generates pattern independent switching current.

While the various transistors discussed above have been identified as NMOS or PMOS transistors, it is understood that the type of transistors may be changed (with corresponding changes to source and drain connections), such that the NMOS transistors are implemented as PMOS transistors and the PMOS transistors are implemented as NMOS transistors, without departing from the scope of the present teachings. Further, while the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flip-flop comprising:
   an amplifier configured to provide an amplified output responsive to input data and a clock;
   a latch configured to provide a latch output that is reset to zero during a reset period at the beginning of each clock cycle of the clock responsive to at least one control signal, and to provide the latch output responsive to the amplified output after the reset period of each clock cycle; and
   a generator configured to generate the at least one control signal responsive to the amplified output provided each clock cycle.

2. The flip-flop of claim 1, wherein the at least one control signal comprises first and second control signals, and the generator comprises:
   a first inverter configured to invert the amplified output;
   a buffer configured to delay an output of the first inverter; and
   a second inverter configured to invert an output of the buffer,
   wherein the output of the first inverter is provided as the first control signal, and an output of the second inverter is provided as the second control signal.

3. The flip-flop of claim 2, wherein the latch comprises first and second transistors connected in series between an output node of the latch and ground, and is configured to reset the latch output during the reset period responsive to the first and second control signals.

4. The flip-flop of claim 3, wherein the latch further comprises a third transistor connected between the output node of the latch and a power supply, the third transistor configured to disconnect the power supply from the output node during the reset period.

5. The flip-flop of claim 4, wherein the third transistor is responsive to the clock.

6. The flip-flop of claim 3, wherein the first and second transistors are PMOS transistors.

7. The flip-flop of claim 3, wherein the first and second transistors are NMOS transistors.

8. The flip-flop of claim 1, wherein the latch is further responsive to the clock.

9. A flip-flop comprising:
   an amplifier configured to provide an amplified output responsive to received input data and a clock;
   a latch comprising first and second transistors connected in series between an output node of the latch and ground, and configured to reset the output node to ground during a reset period at the beginning of each clock cycle of the clock, the first and second transistors operable responsive to respective first and second control signals to set a duration of the reset period; and
   a generator configured to generate the first and second control signals responsive to the amplified output.

10. The flip-flop of claim 9, wherein the generator comprises:
    a first inverter configured to invert the amplified output;
    a buffer configured to delay an output of the first inverter; and
    a second inverter configured to invert an output of the buffer,
    wherein the output of the first inverter is provided as the first control signal, and an output of the second inverter is provided as the second control signal.

11. The flip-flop of claim 10, wherein the duration of the reset period is equivalent to an inherent delay of the buffer plus an inherent delay of the second inverter.

12. The flip-flop of claim 9, wherein the latch further comprises a third transistor connected between the output node of the latch and a power supply, the third transistor configured to disconnect the power supply from the output node during the reset period.

13. The flip-flop of claim 12, wherein the third transistor is responsive to the clock.

14. The flip-flop of claim 9, wherein the latch is further responsive to the clock.

15. The flip-flop of claim 9, wherein the first and second transistors are PMOS transistors.

16. The flip-flop of claim 9, wherein the first and second transistors are NMOS transistors.

17. A flip-flop comprising:
    a latch configured to receive an amplified output from an amplifier, responsive to input data and a clock, and to provide a latch output that is reset to zero during a reset period at the beginning of each clock cycle of the clock responsive to at least one control signal, and to provide the latch output responsive to the amplified output after the reset period of each clock cycle; and
    a control signal generator configured to generate the at least one control signal, the control signal generator including a first inverter configured to invert the amplified output, a buffer configured to delay an output of the first inverter, and a second inverter configured to invert an output of the buffer, wherein the output of the first inverter is provided as the at least one control signal.

18. The flip-flop of claim 17, wherein the at least one control signal comprises first and second control signals, and wherein the output of the first inverter is provided as the first control signal and an output of the second inverter is provided as the second control signal.

19. The flip-flop of claim 18, wherein the latch comprises first and second transistors connected in series between an output node of the latch and ground, and is configured to reset the latch output during the reset period responsive to the first and second control signals.

* * * * *